US 9,490,796 B2

(12) United States Patent
Mandal et al.

(10) Patent No.: US 9,490,796 B2
(45) Date of Patent: *Nov. 8, 2016

(54) POWER-ON-RESET AND SUPPLY BROWN OUT DETECTION CIRCUIT WITH PROGRAMMABILITY

(71) Applicant: STMicroelectronics International N.V., Amsterdam (NL)

(72) Inventors: Pralay Mandal, Kolkata (IN); Sajal Kumar Mandal, Howrah (IN)

(73) Assignee: STMicroelectronics International N.V., Amsterdam (NL)

(*) Notice: Subject to any disclaimer, the term of this patent is extended or adjusted under 35 U.S.C. 154(b) by 0 days.

This patent is subject to a terminal disclaimer.

(21) Appl. No.: 14/675,533

(22) Filed: Mar. 31, 2015

(65) Prior Publication Data
US 2015/0236689 A1    Aug. 20, 2015

Related U.S. Application Data

(63) Continuation of application No. 13/659,722, filed on Oct. 24, 2012, now Pat. No. 9,018,989.

(51) Int. Cl.
*G06F 1/28*  (2006.01)
*H03K 17/22* (2006.01)

(52) U.S. Cl.
CPC .................. *H03K 17/223* (2013.01)

(58) Field of Classification Search
None
See application file for complete search history.

(56) References Cited

U.S. PATENT DOCUMENTS

| | | | |
|---|---|---|---|
| 6,683,481 B1 | 1/2004 | Zhou et al. | |
| 6,744,291 B2 * | 6/2004 | Payne ................. | H03K 17/145 327/143 |
| 7,161,396 B1 * | 1/2007 | Zhou ................... | H03K 17/223 327/143 |
| 7,222,278 B2 * | 5/2007 | Moore ............... | G01R 31/2815 327/205 |
| 7,436,226 B2 | 10/2008 | Kim | |
| 7,450,359 B1 | 11/2008 | Mei et al. | |
| 9,018,989 B2 * | 4/2015 | Mandal ............... | H03K 17/223 327/143 |
| 2008/0048746 A1 * | 2/2008 | Raman ................ | H03K 3/0377 327/205 |
| 2011/0291630 A1 * | 12/2011 | Konstadinidis ....... | H02M 3/157 323/283 |

* cited by examiner

*Primary Examiner* — Long Nguyen
(74) *Attorney, Agent, or Firm* — Slater Matsil, LLP

(57) ABSTRACT

A low-power wideband Power-on-Reset (PoR) and supply brown out detection circuit is proposed, wherein a technique for accurately controlling the PoR trip points and hysteresis voltage is presented. The PoR circuit includes a CMOS circuit with asymmetric rise and fall delays for monitoring wideband supply voltage transients including supply brown out. Being a non-bandgap and non-comparator based circuit, it consumes a very small power and Si area.

27 Claims, 8 Drawing Sheets

POWER-ON-RESET AND SUPPLY BROWN OUT DETECTION CIRCUIT WITH PROGRAMMABILITY

This is a continuation application of U.S. application Ser. No. 13/659,722, entitled "Power-on-Reset and Supply Brown Out Detection Circuit with Programmability" which was filed on Oct. 24, 2012 and is incorporated herein by reference.

TECHNICAL FIELD

The invention relates to trip point and hysteresis voltage programming technique for a Power on Reset (PoR) circuit. The invention also relates to a CMOS circuit with asymmetric rise and fall delays for wideband supply monitoring including supply brown out detection.

BACKGROUND

A Power-on-Reset circuit (PoR) is an indispensable component of system on chip (SoC) application, which provides a reset signal to the digital state machine of the SoC during power up and supply brown out, so that the digital state machine of the SoC starts and operates in a controlled manner. A PoR should be designed keeping in mind a wide variation of supply rise and fall times so that all kinds of supply situations, where the SoC's state machine may malfunction, can be taken care of. The huge number of registers inside a digital state machine of a typical SoC can be satisfactorily put into their reset states if the reset pulse (an active low reset pulse is considered in the present discussion) width (PW_PoR) is wider than a minimum value and the available supply voltage at that time is more than a minimum voltage (Vcmos·min) as shown in FIG. 1. This is because, the reset signal has to propagate to all the registers located probably over a large Si area with considerable capacitive load and the available supply voltage at that time may not be high enough for a quick reset action to take place inside the individual register. For slow supply rise, the required reset pulse width can be maintained using a voltage detector circuit with a proper value of upper trip point (UTP) as shown in FIG. 1. After the power-up and during normal operation of the SoC, if the supply voltage falls slowly below the safe level due to a temporary power failure (slow brown out) and recovers afterwards, a voltage detector with a proper lower trip point (LTP) can detect this by producing a wide enough reset pulse as shown in FIG. 1. Thus in case of slow supply rise and fall, a voltage detector with proper set of trip points and hysteresis voltage (PoR_UTP–PoR_LTP), is sufficient to meet the SoC's supply monitoring requirements. In this case, the hysteresis voltage helps to remove unwanted oscillation on PoR output due to power supply ripple around the trip points as discussed in prior art, U.S. Pat. No. 6,683,481, the relevant teaching of which is incorporated herein by reference. The PoR circuits in prior art 2, U.S. Pat. No. 7,450,359, the relevant teaching of which is incorporated herein by reference in FIG. 4 and prior art 3, U.S. Pat. No. 7,436,226, the relevant teaching of which is incorporated herein by reference in FIG. 5 do not provide any such hysteresis voltage and can be troublesome in the above situation. Therefore, a first area of focus of the present invention is implementation of a positive feedback mechanism circuit for achieving well controlled hysteresis voltage between the trip points of the PoR.

On the other hand, during fast supply rise, after the supply voltage reaches its final value, PoR's output should remain in low state (for an active low reset) for a sufficient time to allow the reset signal to be propagated to all the registers inside the SoC. This reset duration may be insufficient, as shown in FIG. 2a, when a voltage detector with its embedded hysteresis is employed alone. The prior art2 and art3 are made with a voltage detector only, and thus may fail in this fast supply rise condition. This need can be fulfilled by a simple RC delay circuit placed just after the supply detector as discussed in prior art1 and shown in a representative diagram in FIG. 3. After power up, during normal operation of the SoC, the PoR should not respond to the expected synchronous switching noise (SSN) due to synchronous operation of digital circuits. A simple RC delay circuit with proper bandwidth placed after the voltage detector works well in tackling SSN noise too. On the other hand, a PoR should produce a wide enough reset pulse if there is a momentary failure (short lived brown out) in the supply voltage level, which has full potential to push a digital state machine to garbage states, as shown in FIG. 2b. Generation of a reset pulse wider than the short lived supply brown out is not possible with the combination of a voltage detector and simple RC delay circuit as proposed in prior art1. The reason is that the RC circuit equally delays falling (TDF) and the rising (TDR) edges coming out of the voltage detector as shown in FIG. 2b. So, there is a need of a new delay mechanism to address the issue of short lived supply brown out. Thus, a second area of focus of this disclosure is to present a low area CMOS circuit with asymmetric rise and fall delays to handle both the fast supply rise, SSN and short lived brown out cases.

Additionally, the supply voltage of SoCs in sub-65 nm technology has come down below 1.2V, where 40 nm node is being operated with 1.1V (+/−10%) and 28 nm with 1.0V (+/−10%). Thus PoR circuits, required for these SoCs, need to work at low supply voltage. A bandgap and comparator based PoR as presented in prior art 1 would be very difficult to design in such low voltages. Moreover, as bandgap and comparator based PoRs suffer from high power and area consumption, they would not be the prime choice in many low-power compact mobile device applications. In addition, recently dynamic voltage scaling (DVS) is widely used as one of the useful low power techniques. In a DVS technique, the SoC's supply voltage is scaled down as the operating speed requirement comes down. A PoR with a single set of trip points and hysteresis voltage may malfunction in a DVS environment. We should be able to dynamically adjust the PoR's trip points and hysteresis voltage according to the present operating voltage. Thus the third area of focus of this invention is to present a PoR with trip points and hysteresis voltage programmability.

SUMMARY OF THE INVENTION

In accordance with a preferred embodiment of the present invention, a low-power wideband Power-on-Reset (PoR) and supply brown out detection circuit comprises a circuit configured to set programmable trip points, and a circuit configured to set a programmable hysteresis voltage.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Some embodiments of the present disclosure are described in detail with the help of accompanying drawings. However, the disclosure is not limited to these embodiments which are only provided to aid the understanding to the ordinarily skilled people in the relevant art.

Embodiments of the present invention includes a low-voltage supply voltage detector with a positive feedback mechanism for obtaining a hysteresis voltage between the upper and lower trip points of the PoR, a CMOS circuit with asymmetric rise and fall delays and receiving the output of the voltage detector for wideband supply transient monitoring including the supply brown out detection and a mechanism for trip points and hysteresis voltage programmability. The voltage detector is composed of a supply voltage detector with negative feedback mechanism to generate a reference voltage and a positive feedback mechanism to provide hysteresis voltage between the trip points. The voltage detector also includes a mechanism for trip points and hysteresis voltage programmability.

Figure 1:
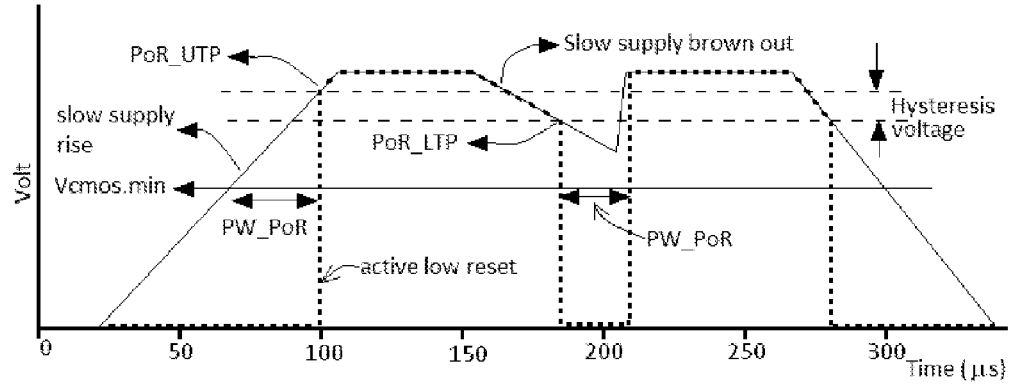
FIG. 1 illustrates the expected behavior of a PoR in case of slow supply rise and fall.
Figure 2:
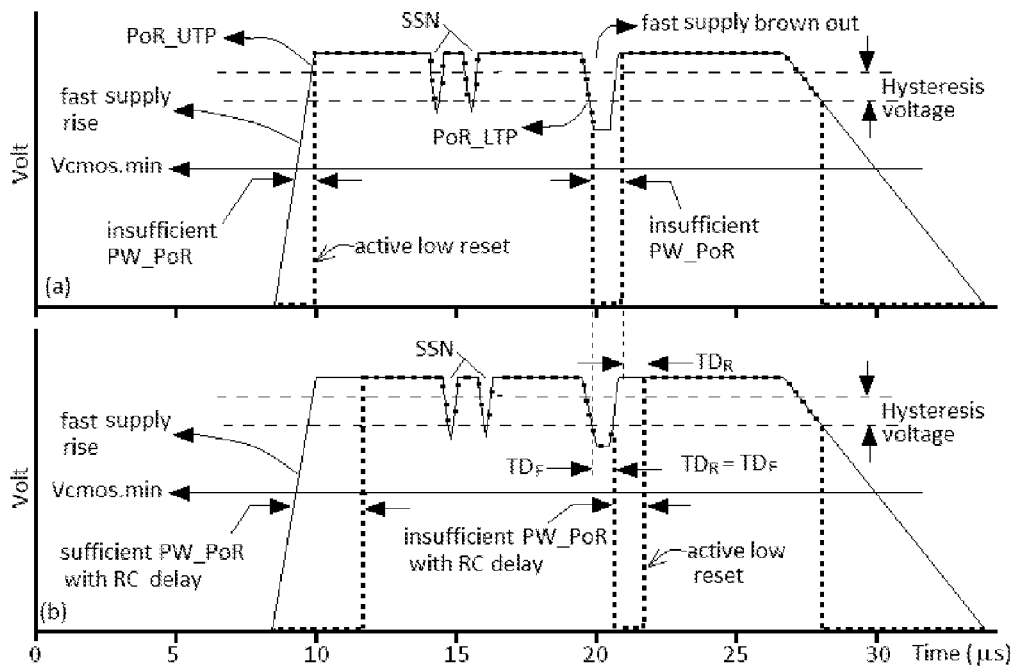
FIG. 2 illustrates the transient response of a generic PoR during fast rise and fall of supply voltage for (a) no RC delay circuit and (b) with a RC delay circuit after the supply voltage detector.
Figure 3:
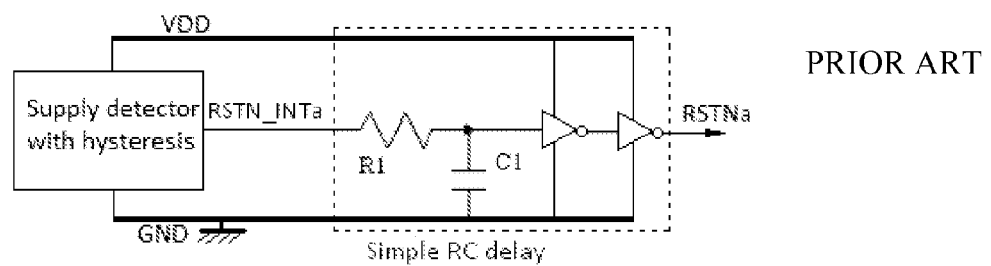
FIG. 3 illustrates a representative diagram for a conventional device.
Figure 4:
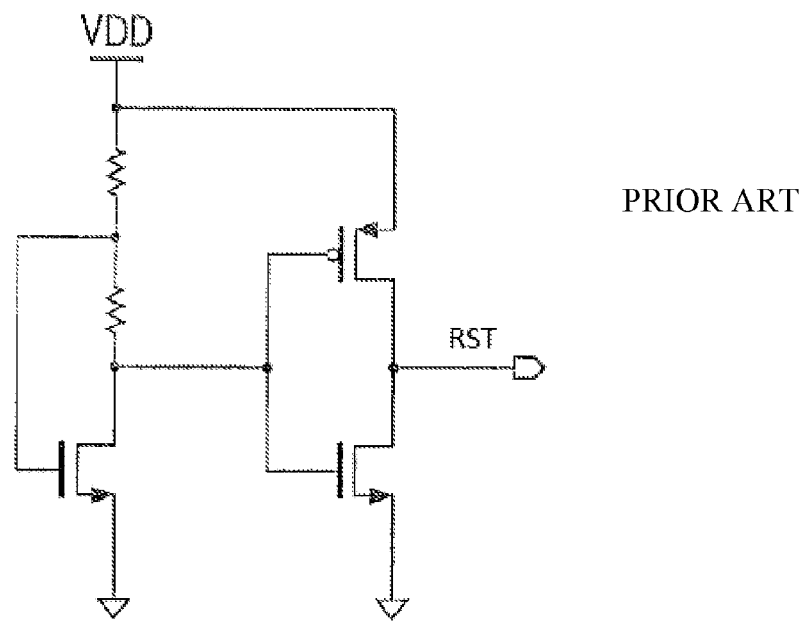
FIG. 4 illustrates a voltage detector according to an embodiment of a conventional device.
Figure 5:
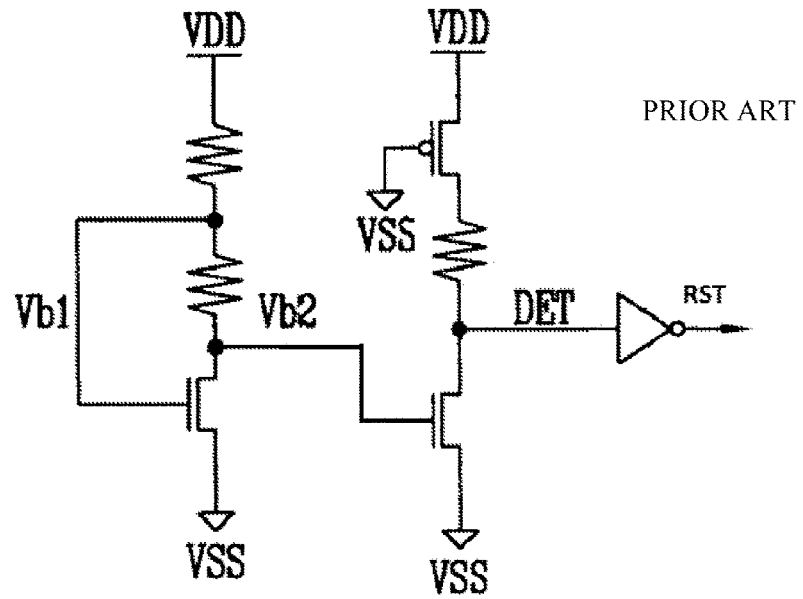
FIG. 5 illustrates a voltage detector according to an embodiment of a conventional device.
Figure 6:
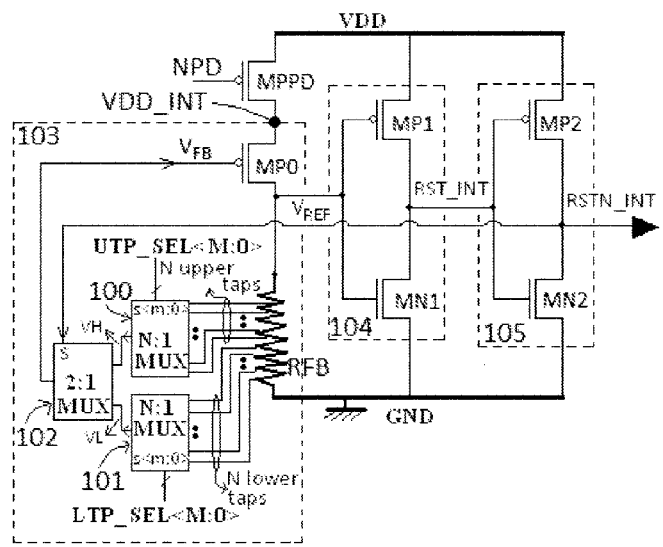
FIG. 6 illustrates a supply voltage detector schematic according to an embodiment of the present invention.
Figure 7:
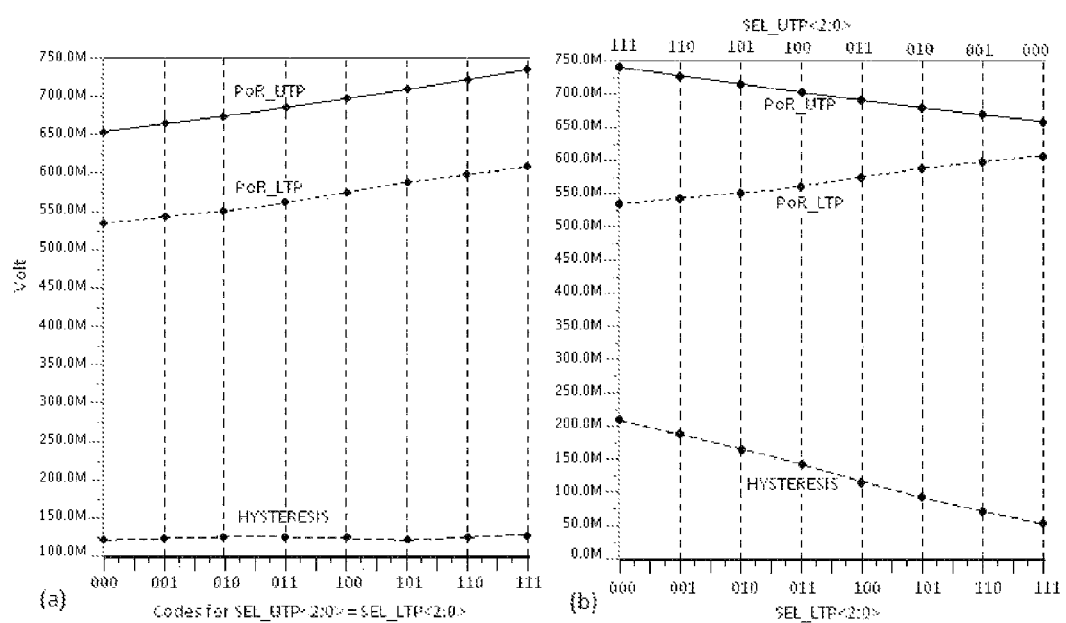
FIG. 7 illustrates the trip points and hysteresis voltage programming of the voltage detector using UTP_SEL<2:0> and LTP_SEL<2:0> according to an embodiment of the present invention.

FIG. 6 illustrates the schematic diagram of a supply voltage detector according to an embodiment of the present disclosure. The supply voltage detector is composed of three blocks 103, 104 and 105, where 103 generates a reference voltage VREF with the help of PMOS transistor MP0 and resistor RFB, where a selected tap point of RFB goes to the gate of MP0 in negative feedback configuration when the voltage detector output RSTN_INT remains in its stable logical level. The output of 103 goes to the input of 104, which is an inverter comprising a PMOS MP1 and a NMOS MN1. The output of 104 is called active high internal reset signal RTS_INT. The inverter 104 finally drives another inverter 105 comprising with a PMOS MP2 and a NMOS MN2. The output of the inverter 105 is called active low internal reset RSTN_INT. The resistor RFB provides a total of 2N numbers of tap points, where N tap points are distributed towards the upper portion of the resistor near to reference voltage VREF and another N taps are on the bottom portion of the resistor near to the ground GND. The reference voltage generator block 103 includes 3 multiplexers 100, 101 and 102, where 100 and 101 are N input multiplexers having a M+1 selection bits (where M+1=2N). The multiplexer 100 connects one of N upper tap points of the resistor RFB to its output VH and decides the upper trip point (UTP) of the voltage detector depending on the value of selection bits UTP_SEL<M:0>. The multiplexer 100 that selects a tap point more near to the VREF higher will set the UTP as will be explained subsequently. Thus UTP_SEL<M:0> can be used for UTP programmability. On the other hand, the multiplexer 101 connects one of N lower tap points of RFB to its output VL and decides the lower trip point (LTP) of the voltage detector depending on the selection bits LTP_SEL<M:0>. The multiplexer 101 that selects a tap point more near to the GND lower will set the LTP as will be explained subsequently. Thus LTP_SEL<M:0> can be used for LTP programmability. Here in this design, the distance between the selected upper and lower tap points of RFB determines the hysteresis voltage of the voltage detector circuit. Thus, when the selected upper and lower tap points move in the same direction (i.e., UTP_SEL<M:0>=LTP_SEL<M:0>) maintaining same (VH-VL), only trip points are changed but hysteresis voltage remains unchanged as shown in FIG. 7a (for a case when M=2). One the other hand, when values of UTP_SEL<M:0> and LTP_SEL<M:0> move in opposite directions, the distance between the upper and lower tap points are changed and so the (VH-VL) and therefore the hysteresis voltage is modified as shown in FIG. 7b. The outputs VH and VL are fed to a two input positive feedback multiplexer 102, whose selection control is connected to RSTN_INT. Therefore, when RSTN_INT is low the output VH of 100, i.e. an upper tap point, is selected by 102 and when RSTN_INT is high the output VL of 101, i.e. a lower tap point, is selected and fed back to the gate terminal VFB of MP0. It will be explained later that the multiplexer 102 provides a positive feedback mechanism during the time when RSTN_INT changes from low to high and vice versa and thus a hysteresis voltage generation is possible between the trip points of the voltage detector.

Figure 8:
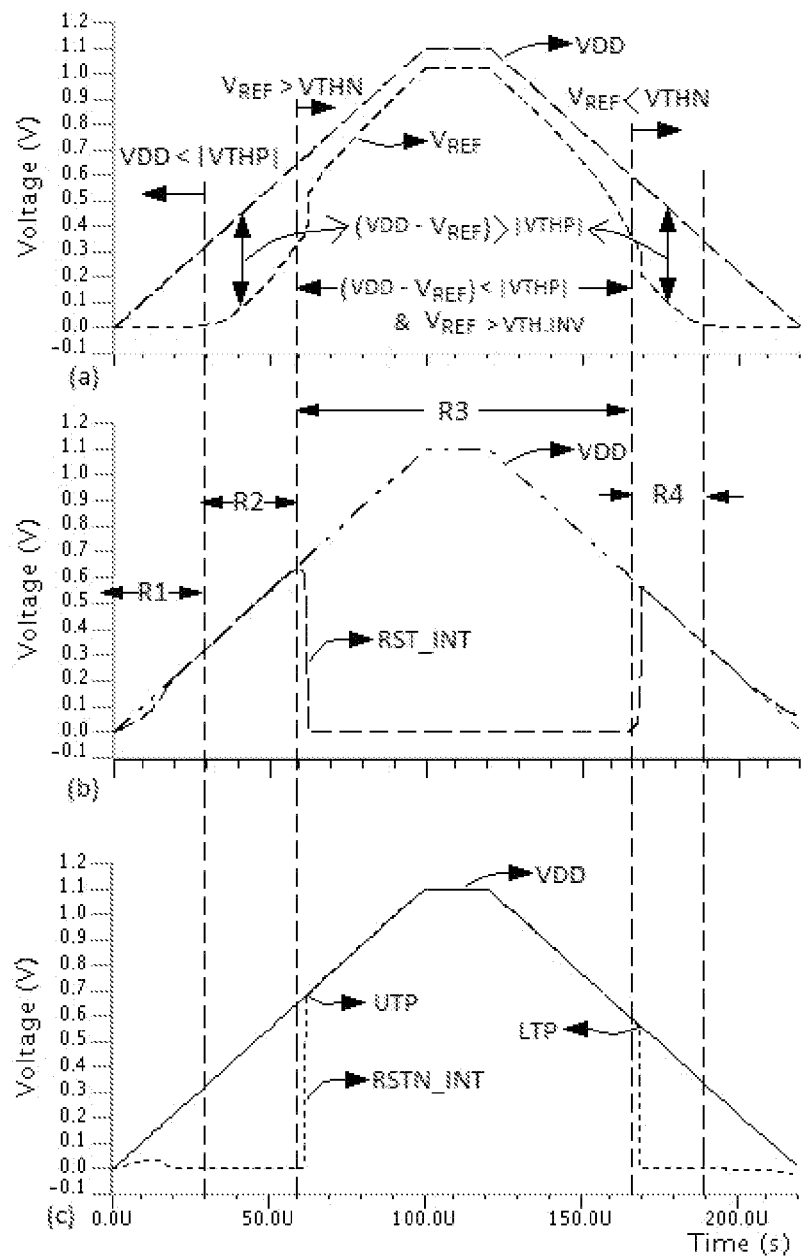
FIG. 8 illustrates variation of voltages at internal nodes VREF, RST_INT and RSTN_INT with the supply voltage at VDD in the proposed supply voltage detector.
Figure 9:
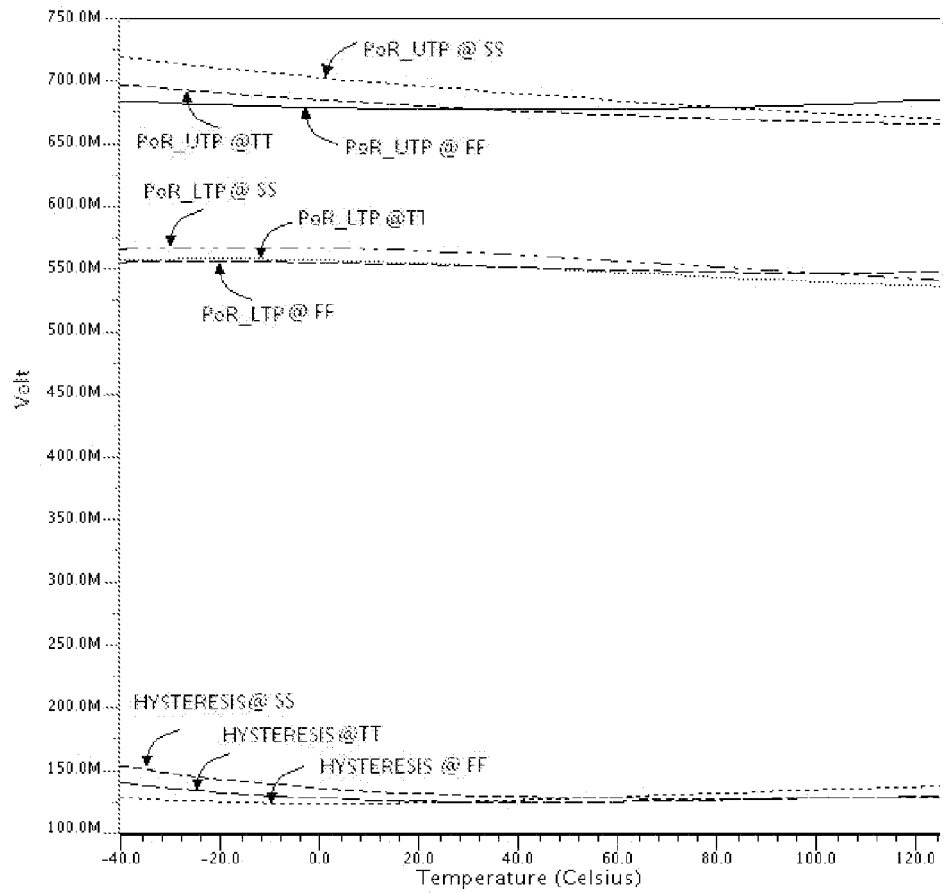
FIG. 9 illustrates the variation of trip points and hysteresis voltage of the voltage detector with temperature on three process corners according to an embodiment of the present invention.

The working principle of the voltage detector circuit is described with the help of plots of various internal node voltages when its supply at VDD rises and falls and shown in FIG. 8. Firstly, the node NPD is connected to zero voltage to make the PoR ON. Secondly, the trip points programming bits UTP_SEL<M:0> and LTP_SEL<M:0> are kept to their default state to all zero voltages. Now, when supply voltage at VDD rises from zero, but remains well below the threshold voltage of PMOS transistor |VTHP| in operating region R1 as shown in FIG. 8, all the tap points of RFB including VREF remain at zero voltage due to discharging of these nodes through RFB to the ground GND. When VDD rises and reaches close to |VTHP|, MPPD, MP1 and MP2 start turning ON and initiate charging of VDD_INT, RST_INT and RSTN_INT nodes. After some time, when RST_INT is charged to a voltage near to the threshold voltage of NMOS transistor VTHN, the MN2 starts turning ON and pulls down RSTN_INT to zero. Thus one of the upper tap points of RFB gets connected to VFB through positive feedback multiplexers 102 and upper tap point select multiplexer 100. In operating region R1 the VDD_INT, RST_INT node voltages continue to rise with VDD. As VDD rises a bit more in region R2, the PMOS MP0 also turns ON and a current starts to flow through the resistor RFB. The tap points of RFB are started to get some voltages depending on their locations and amount of current flow through MP0. The upper tap points are at higher voltages and tap voltages decrease monotonically as we go down the RFB to its lower tap points. Still VREF is low such that (VDD−VREF) remains greater than |VTHP| and VREF remains less than VTHN, i.e., VREF is lower than the logic threshold of the inverter 104. So, output RST_INT of 104 continues to remain at VDD and hence output RSTN_INT of inverter 105 remains at GND. It should be noted that, in region R2, the MP0 finds it more difficult to turn ON as a strong negative feedback comes from an upper tap point voltage of RFB through the multiplexer 100 and 102. Thus the reference voltage VREF remains low but continues to rise with VDD in region R2. Subsequently, in region R3, when VDD rises to a level such that VREF becomes greater than the logic threshold of the inverter 104, the output RTS_INT of the inverter 104 falls to GND. A zero voltage on RST_INT forces the next inverter 105's output RSTN_INT to VDD and thus the active low reset is withdrawn at this point of VDD voltage. During the rise, the voltage at VDD at which the reset is withdrawn is called the upper trip point (UTP) of the voltage detector. In region R3 when the RSTN_INT is going towards VDD, the positive feedback multiplexer 102 changes its selection from the output of 100 to the output of 101 and thus a lower tap point of RFB is now gets connected to VFB. As gate voltage VFB of MP0 suddenly comes down, it boosts the VREF more towards VFB making VREF much more greater the logic threshold of 104 and thus RST_INT is strongly pulled down to GND and RSTN_INT is pulled strongly high to VDD. Therefore it is a positive feedback in the voltage detector loop during the time when RSTN_INT changes its state from GND to VDD. During VDD falling and when the voltage detector moves from region R3 to R4, similar things happen but in reverse order than the case of moving from region R2 to R3. When the voltage detector enters into the region R4, as the gate of MP0 is now connected to a lower tap point, therefore VDD needs to go down further than the UTP point to turn MP0 OFF and this is how a hysteresis voltage is obtained. As VDD falls and makes VREF less than the logic threshold of inverter 104, the output RTS_INT of 104 goes high to VDD and output RSTN_INT of 105 goes down to GND and thus again a reset is produced. This time, as RSTN_INT changes it state from VDD to GND, the multiplexer 102 again changes its selection from a lower to an upper trip point and thus fall in the VREF is intensified due to the positive feedback. During the fall, the voltage at VDD at which the reset is produced, is called lower trip point (LTP) of the voltage detector. The difference between the UTP and LTP is called the hysteresis voltage of the voltage detector. The variation of UTP, LTP and hysteresis voltage of the voltage detector with temperature on three process corners is shown in FIG. 9. The present PoR is able to provide acceptably accurate trip points and hysteresis voltage over PVT without any expensive bandgap reference and comparator circuits and thus consumes low Si area and power.

Figure 10:
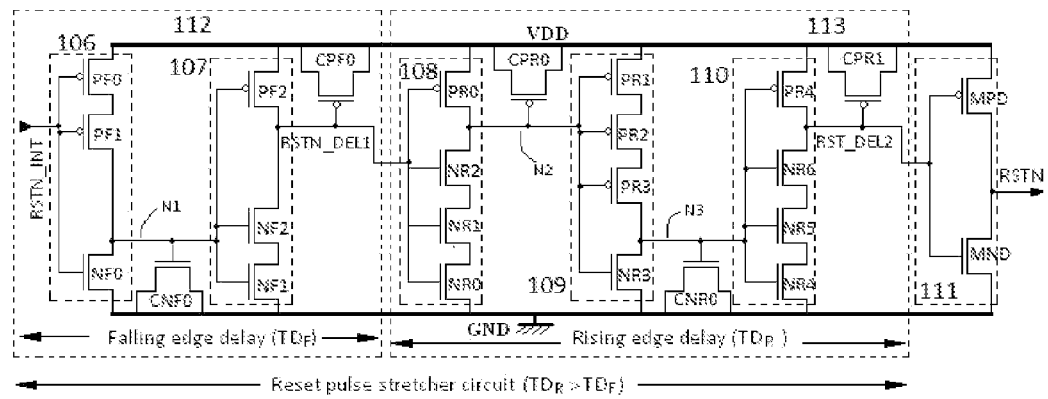
FIG. 10 illustrates a CMOS delay circuit according to an embodiment of the present invention.

Now, as discussed in the background of the invention section a new delay circuit is needed to handle the fast supply rise, SSN and short lived brown out cases. FIG. 10 shows a delay circuit according to an embodiment of the present disclosure. This delay circuit takes the output of the voltage detector RSTN_INT as its input and produces an active low reset signal RSTN at its output. The delay circuit is composed of a falling edge delay circuit 112, a rising edge delay circuit 113 and an inverter 111. The falling edge delay circuit is made of two inverters 106 and 107 with capacitive loads CNF0 and CPF0. The PMOS transistors PF0 and PF1 in 106 are weak transistors, i.e., their lengths are much larger than their widths, whereas NF0 is a strong NMOS transistor, i.e., its width is much larger than its length. Thus a falling edge is delayed more than a rising edge by the inverter 106. The NMOS transistors NF1 and NF2 are weak and PMOS transistor PF2 is strong inside the inverter 107 and thus it delay a rising edge more than a falling edge. Therefore, effectively the combination of 106, 107, CNF0 and CPF0 delays the incoming falling edge much more than the rising edge. So, RSTN_INT faces a considerable falling edge delay (TDF) and a negligible rising edge delay by circuit 112 and produces RSTN_DEL1 signal for the next stage. Similarly the delay circuit 113, with its inverters 108, 109 and 110, is designed to provide a rising edge delay TDR. In the delay circuit 113, PR1, PR2 and PR3 are weak PMOS transistors, whereas PR0 and PR4 are strong one. The NMOS transistors NR0, NR1, NR2, NR4, NR5 and NR6 are weak and NR3 is a strong one. The capacitor CPR0, CPR1 and CNR0 are used to enhance the delay TDR. The delay TDR and TDF are decided such that (TDR−TDF) is greater than the minimum required reset pulse width PW_PoR. The last inverter 111, which produces the final active low reset signal RSTN, is made with two strong transistors MPD and MND so that it can drive the SoC.

Figure 11A:
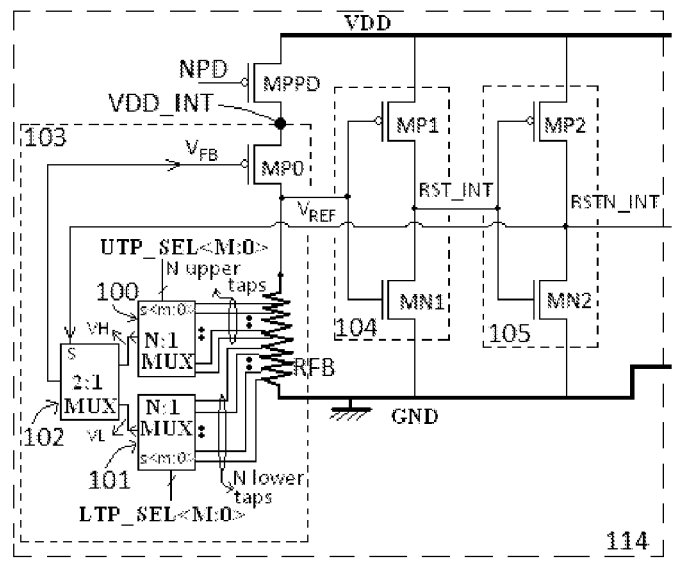
FIGS. 11a and 11b illustrate the complete PoR circuit diagram according to an embodiment of the present invention.
Figure 11B:
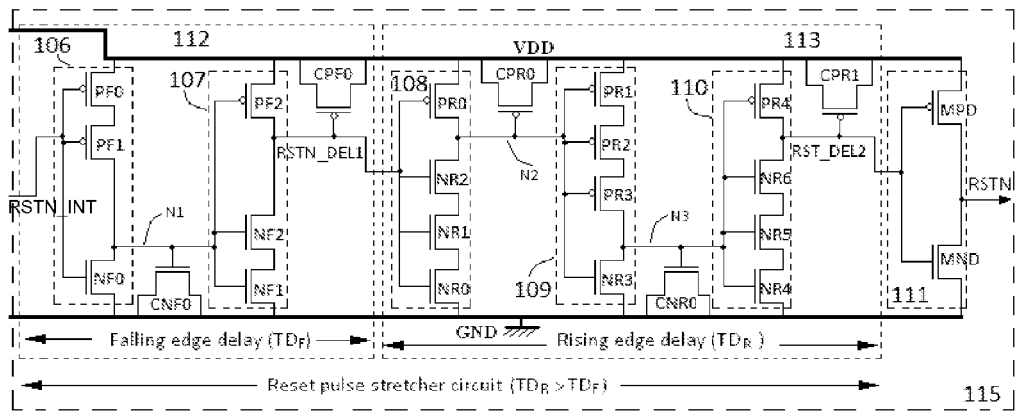
Figure 12A:
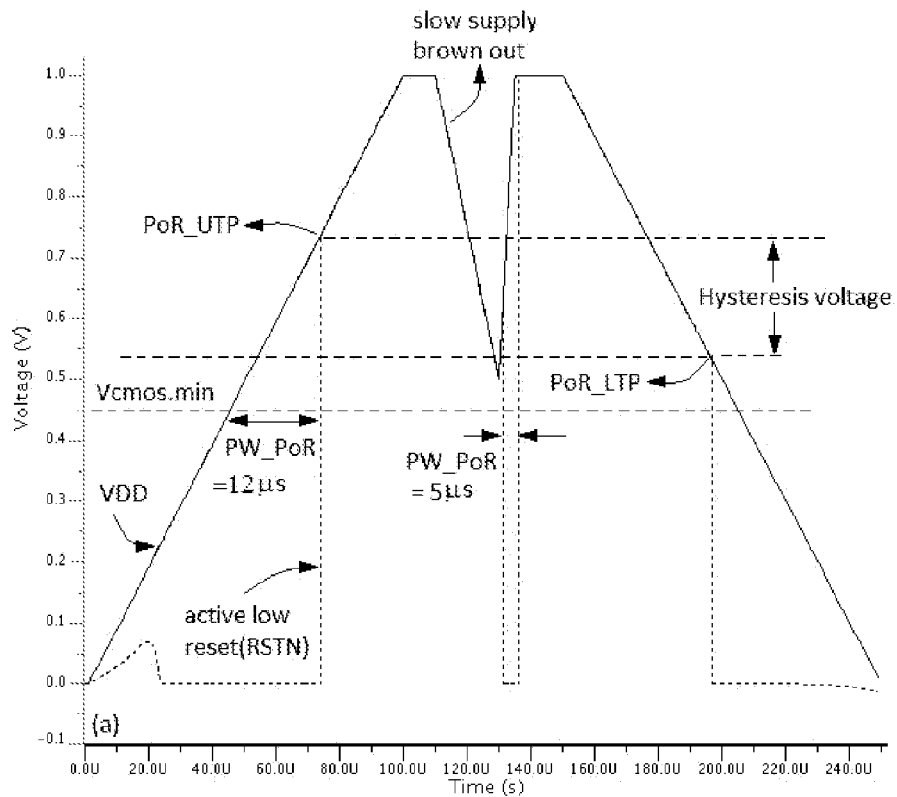
FIG. 12a illustrates the transient behavior of the PoR for slow supply rise, fall and slow supply brown out.

The transient behavior of the complete PoR circuit, as shown in FIGS. 11a and 11b, is described hence forth. When supply voltage at VDD slowly (meaning the supply rise time is much greater than TDR and TDF) rises the voltage detector 114 monitors it and produces a low RSTN_INT below its UTP. A low RSTN_INT at the input of the delay circuit 115 produces a low RSTN at the output. In this case delay of 115 is not visible as supply rise time is comparatively very high as shown in FIG. 12a. During slow rise, the voltage of VDD at which RSTN goes high is called the upper trip point of the PoR (PoR_UTP). In this slow supply rise case PoR_UTP is same as UTP of the voltage detector 114. When supply voltage at VDD slowly falls below LTP of the voltage detector 114, the RSTN_INT and finally RSTN goes low as shown in FIG. 12a. During the fall, the VDD voltage at which the PoR output goes low is called the lower trip point of the PoR (PoR_LTP). In a slow supply fall situation PoR_LTP will be same as LTP of the voltage detector 114. Reset pulse width PW_PoR can be large enough in the slow supply rise and fall cases if the PoR_UTP and PoR_LTP are properly fixed as shown in FIG. 12a.

Figure 12B:
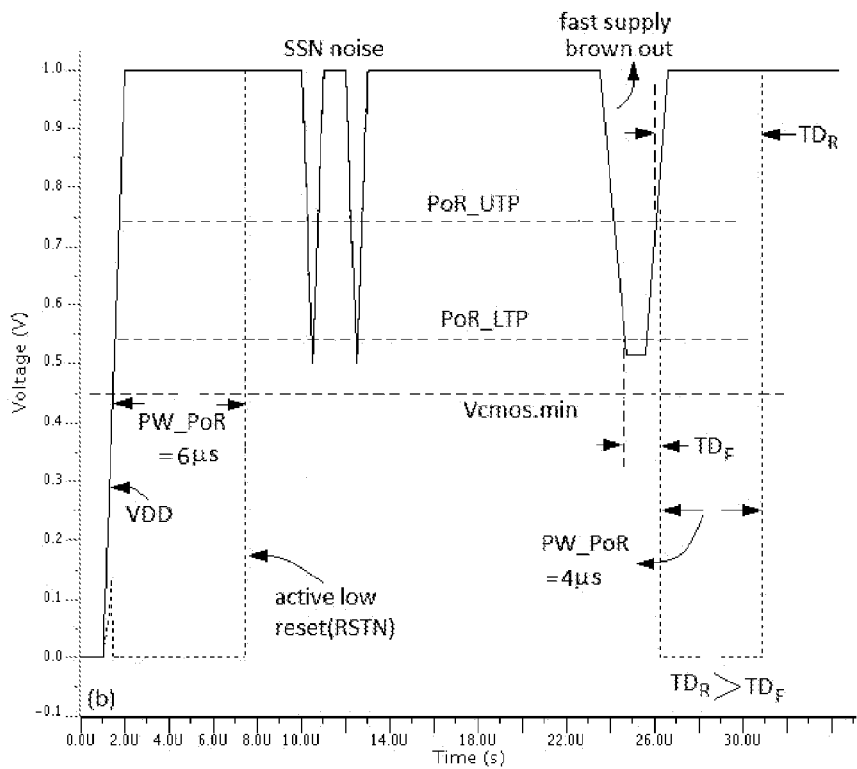
FIG. 12b illustrates the transient behavior of the PoR for fast supply rise, fall, SSN and fast supply brown out cases according to an embodiment of the present invention.

One the other hand, when supply rises very fast (meaning rise time of the supply is very small compared to TDR and TDF) and surpasses the voltage detector's UTP, the RSTN_INT and RSTN_DEL1 rise very quickly to VDD but it is delayed by TDR by the delay circuit 113. Hence, the final output RSTN of the PoR remains low for TDR time duration before going up to VDD. This helps the propagation of RSTN to a large number of registers inside the SoC. The fast SSN noise which generally does not impact the SoC's normal operation, may produce a narrow low going pulse at voltage detector output RSTN_INT. But, it is filtered by the delay circuit 112 and thus does not appear at its output RSTN_DEL1 and thus the final PoR output RSTN remains at VDD as shown in FIG. 12b. Thus TDF is selected according to the extent of SSN filtering need. On the other hand, when a fast supply brown out occurs which may lead to a SoC malfunction, is handled by the present PoR as follows. When VDD quickly falls below LTP of voltage detector 114, its output RSTN_INT falls to zero. This falling edge of RSTN_INT is delayed by TDF due to the delay circuit 112. Now, when VDD quickly recovers and surpasses UTP of voltage detector, the RSTN_INT and RSTN_DEL1 quickly go high to VDD. This rising edge of RSTN_DEL1 is now delayed by TDR by the delay circuit 113. The time duration for which PoR's output RSTN remains low is the difference between the TDR and TDF as shown in FIG. 12b. The TDR and TDF are selected such that their difference is more than the required minimum reset pulse width by the SoC. The present disclosure, by increasing the TDR and minimizing TDF, stretches the reset pulse width in time domain relative its creator, the short lived supply brown out. Hence, this delay circuit implements a pulse stretching action. Therefore, at the slow supply rise and fall the voltage detector 114's UTP and LTP, in high frequency the delay circuit 115 and in medium frequency the combination of 114 and 115 help in generating a reset pulse wider than minimum required. Thus the present PoR works in a wideband supply voltage transients including the supply brown out detection.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a supply voltage detector configured to
      set independently programmable trip points,
      set a programmable hysteresis voltage,
      detect a supply voltage level, and
      produce an active low internal reset signal depending on the detected supply voltage level, the independently programmable trip points, and the programmable hysteresis voltage; and
   a delay circuit configured to receive the active low internal reset signal and to introduce delays on rising and falling edges of the active low internal reset signal to produce a final active low reset signal.

2. The device as set forth in claim 1, wherein the supply voltage detector comprises:
   a power down PMOS transistor;
   a reference voltage generator coupled to the power down PMOS transistor and configured to generate a reference voltage;
   a first inverter configured to receive the reference voltage as its input to produce an active high internal reset signal; and
   a second inverter configured to receive the active high internal reset signal as its input to produce the active low internal reset signal.

3. The device as set forth in claim 2, wherein the power down PMOS transistor comprises a source connected to a supply voltage node and a gate connected to an active low power down control signal.

4. The device as set forth in claim 2, wherein the reference voltage generator comprises:
   a feedback PMOS transistor having a source connected to a drain of the power down PMOS transistor;
   a resistance element having a first terminal connected to a drain of the feedback PMOS transistor and a second terminal connected to ground;
   an N input upper trip point selection multiplexer coupled to the resistance element and configured to produce an upper trip point signal;
   an N input lower trip point selection multiplexer connected to the resistance element and configured to produce a lower trip point signal; and
   a two input positive feedback multiplexer coupled to the N input upper trip point selection multiplexer and the N input lower trip point selection multiplexer and configured to produce a feedback voltage at a gate of the feedback PMOS transistor.

5. The device as set forth in claim 2, wherein the first inverter comprises a first PMOS transistor and a first NMOS transistor and wherein the second inverter comprises a second PMOS transistor and a second NMOS transistor.

6. The device as set forth in claim 1, wherein the delay circuit delays an incoming rising edge of the active low internal reset signal by a first amount of time and delays an incoming falling edge of the active low internal reset signal by a second amount of time.

7. The device as set forth in claim 6, wherein the first amount of time is selected to be greater than the second amount of time to an extent necessary to achieve a required minimum reset pulse width.

8. The device as set forth in claim 6, wherein the delay circuit holds the final active low reset signal to a low level for the first amount of time when a voltage supply signal quickly rises.

9. The device as set forth in claim 1, wherein the delay circuit stretches a reset pulse of the active low internal reset signal to an acceptable value when a short supply brown out occurs.

10. The device as set forth in claim 1, wherein the delay circuit holds the final active low reset signal to the supply voltage level when very high frequency synchronous switching noise (SSN) noise appears.

11. The device as set forth in claim 1, wherein the voltage detector in combination with the delay circuit is configured to monitor wideband supply transients including detecting a supply brown out.

12. The device as set forth in claim 1, wherein the device is configured to have an upper trip point equal to the upper trip point of the voltage detector when the voltage supply rises very slowly.

13. The device as set forth in claim 1, wherein the device is configured to have a lower trip point equal to the lower trip point of the voltage detector when the voltage supply falls very slowly.

14. The device of claim 1, wherein the independently programmable trip points comprise an upper trip point and the supply voltage detector is also configured to set the upper trip point that is programmed dynamically using binary control signals.

15. The device of claim 14, wherein the independently programmable trip points comprise a lower trip point and the supply voltage detector is also configured to set the lower trip point that is programmed dynamically using further binary control signals.

16. The device of claim 1, wherein the supply voltage detector further comprise no bandgap reference.

17. The device of claim 1, wherein the delays introduced by the delay circuit comprise asymmetric delays.

18. A method of operating a device, the method comprising:
setting independently programmable trip points in a supply voltage detector;
setting a programmable hysteresis voltage in the supply voltage detector;
detecting a supply voltage level;
producing an active low internal reset signal depending on the detected supply voltage level, the independently programmable trip points, and the programmable hysteresis voltage; and
receiving the active low internal reset signal at a delay circuit; and
producing a final active low reset signal by introducing delays on rising and falling edges of the active low internal reset signal.

19. The method of claim 18, wherein introducing delays on rising and falling edges of the active low internal reset signal comprises:
delaying an incoming rising edge of the active low internal reset signal by a first amount of time; and
delaying an incoming falling edge of the active low internal reset signal by a second amount of time.

20. The method of claim 19, wherein the first amount of time is selected to be greater than the second amount of time to an extent necessary to achieve a required minimum reset pulse width.

21. The method of claim 18, further comprising monitoring wideband supply transients in order to detect a supply brown out.

22. The method of claim 18, wherein
the independently programmable trip points comprise an upper trip point; and
setting the independently programmable trip points comprises setting the upper trip point by dynamically programming the upper trip point using binary control signals.

23. The method of claim 22, wherein
the independently programmable trip points further comprise a lower trip point; and
setting the independently programmable trip points further comprises setting the lower trip point by dynamically programming the lower trip point using binary control signals.

24. A device comprising:
a supply voltage detector configured to independently set a programmable upper trip point, independently set a programmable lower trip point, and generate an internal reset signal based on a supply voltage level, the programmable upper trip point, and the programmable lower trip point, wherein the supply voltage detector comprises:
an output circuit having an output terminal configured to supply the internal reset signal,
a resistance element having a plurality of tap points,
a first multiplexer having a plurality of inputs coupled to tap points of the plurality of tap points, wherein the first multiplexer is configured to set the programmable upper trip point based on selecting one tap point of the plurality of tap points,
a second multiplexer having a plurality of inputs coupled to tap points of the plurality of tap points, wherein the second multiplexer is configured to set the programmable lower trip point based on selecting one tap point of the plurality of tap points, and
a third multiplexer coupled to an output of the first multiplexer and an output of the second multiplexer, wherein the third multiplexer is configured to select the programmable upper trip point or the programmable lower trip point for generating internal reset signal based on a signal on the output terminal.

25. The device of claim 24, further comprising a delay circuit configured to receive the internal reset signal and to introduce delays on rising and falling edges of the internal reset signal to produce a final reset signal.

26. The device of claim 25, wherein the delay circuit delays an incoming rising edge of the internal reset signal by a first amount of time and delays an incoming falling edge of the internal reset signal by a second amount of time.

27. The device as set forth in claim 26, wherein the first amount of time is selected to be greater than the second amount of time to an extent necessary to achieve a required minimum reset pulse width.

* * * * *